United States Patent [19]

Herman

[11] 4,342,097
[45] Jul. 27, 1982

[54] MEMORY BUFFER

[75] Inventor: Morris Herman, Santa Barbara, Calif.

[73] Assignee: Raytheon Company, Lexington, Mass.

[21] Appl. No.: 125,721

[22] Filed: Feb. 28, 1980

[51] Int. Cl.³ .......................... G06F 3/04; G06F 7/00
[52] U.S. Cl. ..................................... 364/900; 307/58; 340/870.13
[58] Field of Search ...................... 235/92 EA, 92 TF; 364/200 MS File, 900 MS File; 370/77, 108, 370/58; 375/118; 340/870.13

[56] References Cited

U.S. PATENT DOCUMENTS

| | | | |
|---|---|---|---|
| 3,742,456 | 6/1973 | McFiggans et al. | 364/200 |
| 3,922,670 | 11/1975 | Shaw et al. | 235/92 TF |
| 4,137,562 | 1/1979 | Boeck et al. | 364/200 |
| 4,153,944 | 5/1979 | Grandle, Jr. | 364/900 |
| 4,158,834 | 6/1979 | Nakanishi et al. | 364/900 |
| 4,206,346 | 6/1980 | Hirosawa et al. | 235/92 PD |
| 4,219,875 | 8/1980 | Templeton | 364/200 |

FOREIGN PATENT DOCUMENTS

| | | |
|---|---|---|
| 1064948 | 4/1967 | United Kingdom . |
| 1295255 | 11/1972 | United Kingdom . |
| 1452335 | 10/1976 | United Kingdom . |
| 1487706 | 10/1977 | United Kingdom . |

OTHER PUBLICATIONS

Moore and Schulman, "Instruction Trace Apparatus", IBM Tech. Discl. Bull., vol. 20, No. 9, Feb. 1978, pp. 3503-3506.

Primary Examiner—Gareth D. Shaw
Assistant Examiner—Eddie P. Chan
Attorney, Agent, or Firm—Richard M. Sharkansky; Joseph D. Pannone

[57] ABSTRACT

A memory buffer is provided between a receiving system and a digital computer to provide an indication of the number of times pulses from the same source have been received in a predetermined interval of time upon interrogation of the memory buffer by the digital computer while such memory buffer continues to function without interruption during the interrogation process so that information from pulses received during such interrogation by the digital computer is retained.

3 Claims, 21 Drawing Figures

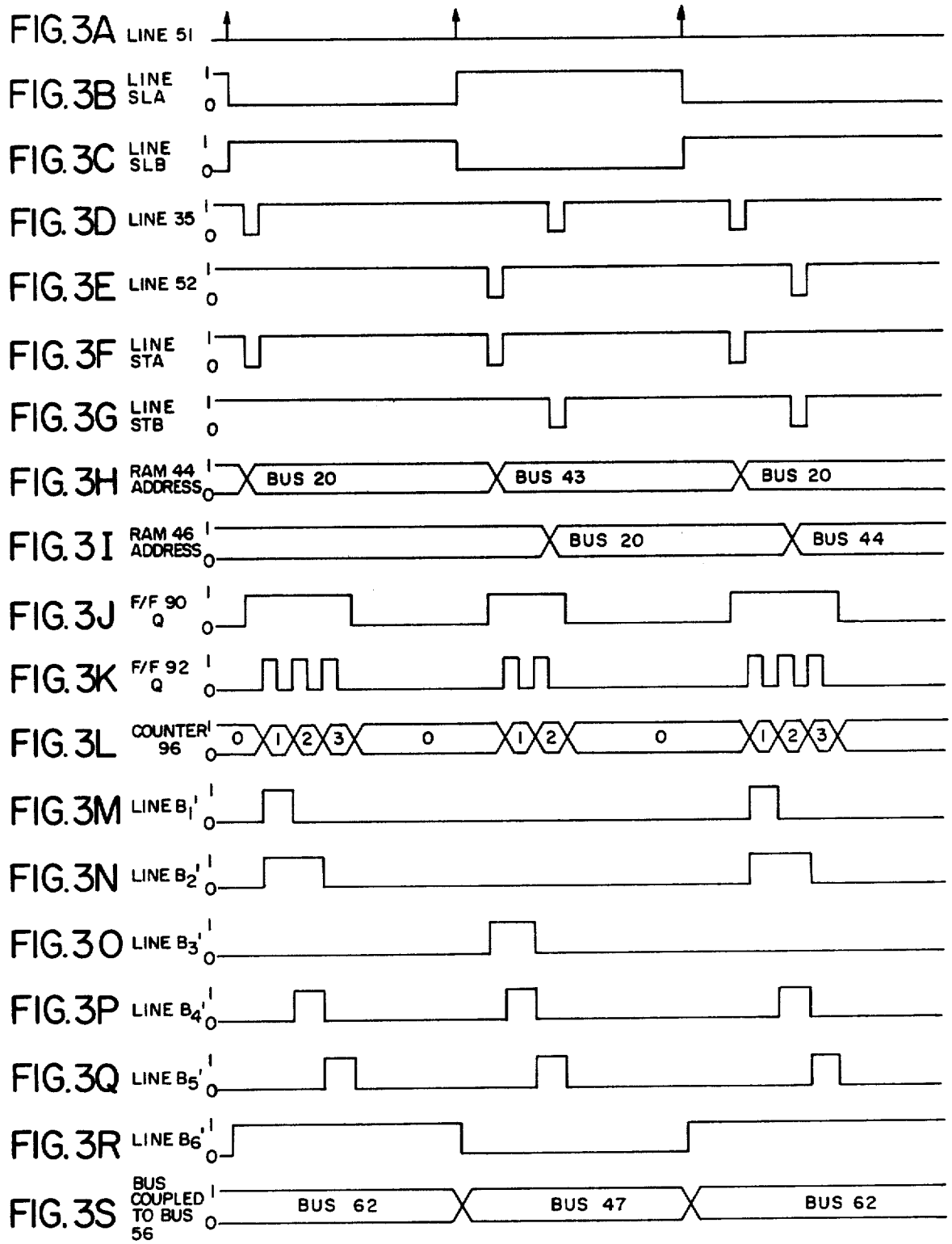

MEMORY BUFFER

BACKGROUND OF THE INVENTION

This invention relates generally to electronic countermeasure systems and more particularly to systems of such type which use digital computers for determining the number of pulses received from each one of a plurality of jamming sources.

As is known in the art, early electronic counter measure (ECM) systems received signals from various RF energy jamming sources, sometimes referred to as "emitters", and presented the location of such emitters on a suitable display, such as a cathode ray tube (CRT). An operator would observe the CRT display, tune his receiver to separate in frequency each of the emitters, perform manual direction finding, select the appropriate emitter to be jammed and transmit an appropriate jamming modulation. Other early ECM systems used repeater jammers which transmitted all signals received in a fixed frequency passband. A short coming of these early ECM systems was that they did not provide an automatic emitter identification and prioritization.

In more modern ECM systems, the signal processing emitter identification and jamming assignment must generally be done automatically because the emitter environment, both friendly and hostile, may be so dense that a single operator would not generally be able to perform the emitter identification task. Such a modern ECM system generally includes receiving equipment, signal processing equipment, digital computer, displays, a signal generator, and transmission equipment. The receiving equipment and signal processing equipment convert various characteristics of each emitter into a digital word. The characteristics are typically the emitter's direction and frequency. These digital words are fed to the digital computer which provides appropriate display for the operator and also automatically assigns jamming resources on a somewhat optimum basis to the threatening emitters.

In order to establish whether received radio frequency signals are from a valid emitter or from noise or in order to calculate the pulse repetition interval (PRI) of such emitter it is sometimes necessary to determine the number of times pulses from each one of the emitters are received in predetermined intervals of time. As mentioned above, in modern ECM systems, as each emitter signal is received it is generally converted into a digital word, one portion of the digital word may represent the direction of the emitter and the other portion of the digital word may represent the carrier frequency of the RF energy produced by the emitter. Hence each digital word may be considered as providing an identification of the emitter since each different emitter may be considered as having a unique carrier frequency and direction. For example if a first digital word is produced in response to a first received pulse indicating that the emitter's RF energy has a direction of 150 degrees and a frequency of 3.79 GHZ and a pulse is subsequently received from an emitter having the same direction and the same frequency it is very likely that both pulses came from the same emitter. Hence it follows that by counting the number of times the same unique digital word is produced in a predetermined period of time the pulse repetition interval of the pulses produced by the same emitter may be determined. Unfortunately, in many environments the number of emitters and pulse repetition frequency of each emitter are so great that the rate of pulses received by the apparatus may be greater than the processing rate of the digital computer and hence such digital computer might not be able to keep up with each one of the received pulses with the result that information may be lost by the digital computer.

SUMMARY OF THE INVENTION

In accordance with the present invention a memory buffer is provided between a receiving system and a digital computer to provide an indication of the number of times pulses from the same emitter have been received in a predetermined interval of time upon interrogation of the memory buffer by the digital computer while such memory buffer continues to function without interruption during the interrogation process so that information from pulses received during such interrogation by the digital computer is retained.

In a preferred embodiment of the invention the receiving system produces a digital word in response to each received pulse; a first portion of the produced digital word representing the direction of the emitter producing such pulse and, the second portion of the digital word representing the carrier frequency of the received pulse. In this way each different emitter is associated with a unique one of the produced digital words.

The memory buffer includes a pair of addressable memories; when one of such memories is addressed by the receiving system the other one of such memories is addressed by the digital computer. The address supplied by the receiving system is the digital word produced by such system and hence each location in such the addressed memory corresponds to a different emitter. The memory buffer is arranged so that the contents in each location represents the number of pulses which have been received from the emitter corresponding to that location. The address supplied by the digital computer is a digital word which has a first portion representative of the direction of a potential emitter and a second portion representative of the frequency of such emitter. Hence each digital word produced by the digital computer also corresponds to an emitter. When the digital word produced by the digital computer addresses the memory, the contents in the addressed location of such memory are read to provide the digital computer with an indication of the number of pulses which have been received from the emitter which corresponds to the addressed location. At predetermined, periodic intervals of time the address supplied to one of the pair of memories alternates from the receiving system to the digital computer while the address supplied to the other one of the pair of memories alternates from the digital computer to the receiving system. In this way during the same interval of time one of the pair of memories is addressed by the receiving system and the other one of the pair of memories is addressed by the digital computer. During successive interval of time, however, the one of the pair of memories previously addressed by the receiving system now becomes addressed by the digital computer and the one of the pair of memories previously addressed by the digital computer now becomes addressed by the receiving system. In this way the address to each one of the memories periodically alternates between the receiving system and the digital computer.

More particularly, each digital word produced by the receiving system provides an address for one of the pair of memories in the memory buffer. Since each unique digital word is associated with a unique emitter, and hence identifies such emitter, each memory location is associated with a different emitter. The contents of the pair of memories are initially reset to zero. As each digital word produced by the receiving system is fed to address the first one of the pair of memories the contents of such memory, at such addressed location, is read, incremented by one, and then written back into the memory at the same addressed location. It follows then that the contents of each location in the first one of the pair of memories provide an indication of the number of pulses received from each one of the different emitters associated with the different locations in the first memory. At a predetermined interval of time the digital words produced by the receiver are fed to the second one of the pair of memories and the data stored in the first one of the pair of memories is available for interrogation by the digital computer. When the digital computer wishes to interrogate the memory buffer to determine the number of times pulses have been received from a selected, potential emitter during the last predetermined interval of time, the digital computer produces a digital word representative of the direction and frequency of the selected, potential emitter and in response to an interrogation strobe pulse such digital word is coupled to address the first one of the pair of memories, i.e. the one of the pair of memories, previously addressed by the digital words produced by the receiver. The contents in such addressed location are read from the first one of the pair of memories and provides an indication of the number of pulses received by the selected, potential emitter. The contents of the addressed location are then reset to zero. During this period of time each one of the locations in the first one of the pair of memories may be read by feeding a sequence of digital words and a sequence of interrogating strobe pulses to the first one of the pair of memories. Simultaneously with the interrogation by the digital computer of the first one of the pair of memories the digital words produced by the receiver are coupled to the second one of the pair of memories so that any received pulses are, during the time the digital computer is interrogating the first one of the pair of memories, used to address the second one of the pair of memories. The contents of the addressed location in the second one of the pair of memories are incremented and then restored in the addressed location. In this way, the contents of each one of the location of the second one of the pair of memories provide an indication of the number of pulses received from the different emitters. During the next interval of time the digital words produced by the receiver are again used to address the first one of the pair of memories and the digital words produced by the digital computer are again used to address the second one of the pair of memories. In this way one of the pair of memories is available for maintaining a count of the number of times pulses are received by the receiving system from each emitter and the other one of the memories is available for the digital computer to provide to such digital computer with a count of the number of times pulses from each of the emitters have been received during the last previous interval of time.

BRIEF DESCRIPTION OF THE DRAWINGS

The above-mentioned and other features of the invention will become more apparent by reference to the following description taken together in connection with the accompanying drawing in which:

FIGS. 3A to 3S are timing diagrams useful in understanding the operation of the memory buffer shown in FIG. 2.

DESCRIPTION OF THE PREFERRED EMBODIMENT

Figure 1:
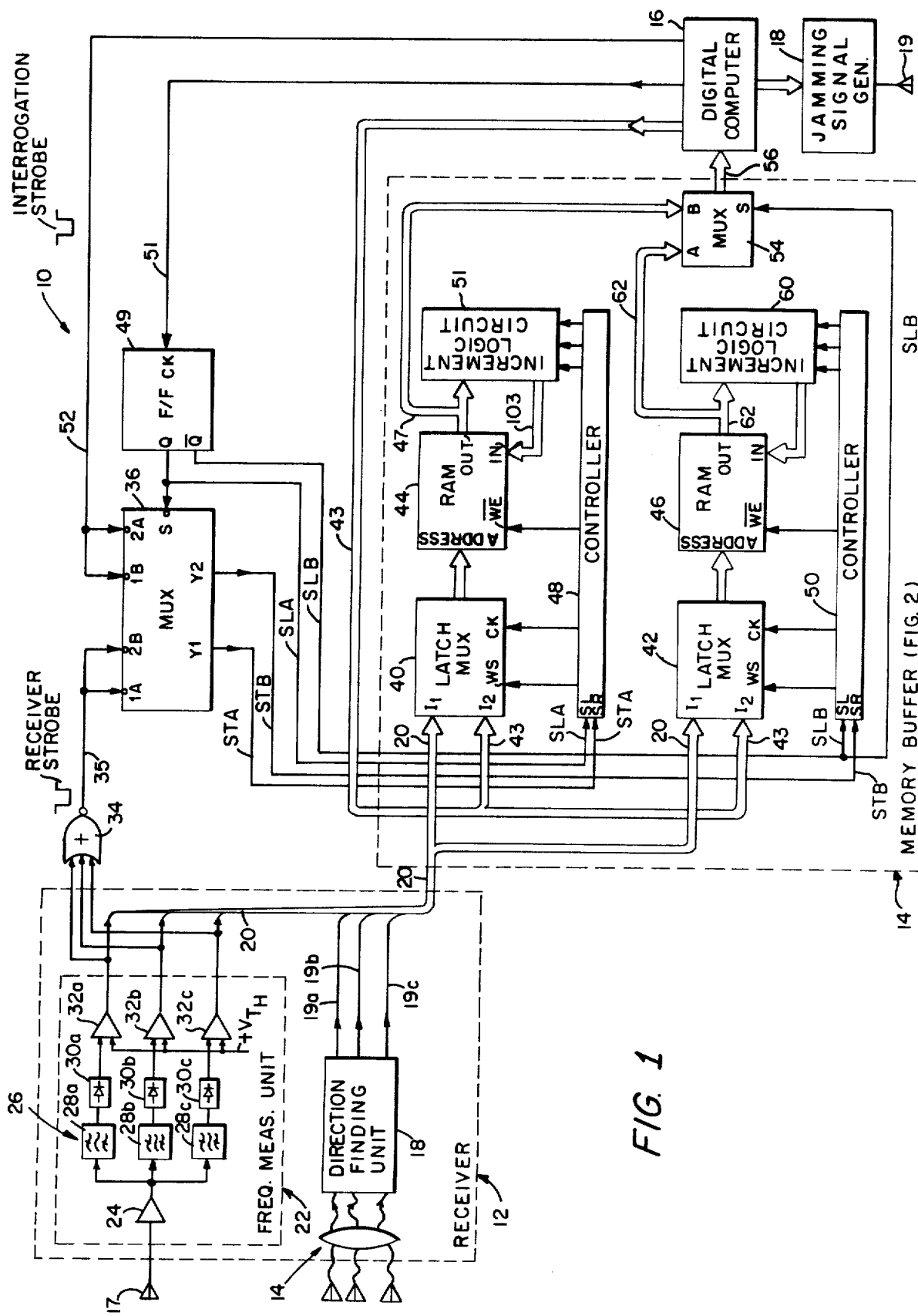
FIG. 1 is a block diagram of an electronic countermeasure (ECM) system using a memory buffer according to the invention.

Referring now to FIG. 1 an electronic countermeasure system 10 is shown to include a receiver 12 coupled to a multi-beam antenna 14 and an omni directional antenna 17 as shown. The omni directional 17 and the multi-beam antenna 14 are adapted to receive radio frequency energy pulses from jamming sources, sometimes referred to as emitters (not shown). In response to each received pulse, such receiver 12 produces a digital word on bus 20, a first portion of such digital word representing the direction of the emitter and a second portion of the digital word representing the frequency of the received pulse. In particular, receiver 12 includes direction finding apparatus 18 of any conventional design here for example apparatus described in U.S. Pat. No. 4,107,692 Inventor Hutcheon et al issued Aug. 15, 1978 entitled Radio Frequency Signal Direction Finding System and assigned to the same assignee as the present invention. Direction finding apparatus 18 produces a digital word here having three bits, each bit appearing on a respective one of the lines 19a, 19b and 19c. These three bits represent the angle of arrival or direction of each received pulse. Receiver 12 also includes frequency measuring apparatus 22, here such frequency measuring apparatus 22 includes a radio frequency amplifier 24 fed by the omni directional antenna 17. The output of radio frequency amplifier 24 is fed to a bank of filters 26 here three filters 28a, 28b and 28c such filters being tuned to different contiguous portions of the band of frequencies passed by radio frequency amplifier 24. Thus, here band pass filter 28a passes the upper third portion of the band of frequencies passed by radio frequency amplifier 24, band pass filter 28b passes the middle third portion of such band of frequencies and band pass filter 28c passes the lower third portion of such band of frequencies. The outputs of band pass filters 28a, 28b and 28c are fed to detectors 30a, 30b and 30c respectively as shown. Such detectors thereby produce DC voltages in response to radio frequency energy passing through the band pass filters coupled thereto. The outputs of detectors 30a, 30b and 30c are fed to comparators 32a, 32b and 32c as shown. Also fed to such comparators is a threshold voltage $V_{TH}$ as shown. In operation, if a received pulse has a frequency in the upper third of the band of frequencies passed by radio frequency amplifier 24 a relatively large DC voltage is produced at the output of detector 30a compared to the DC voltages produced by detectors 30b, 30c. If the voltage produced by the detector 30a is larger than the threshold voltage $V_{TH}$ a logical 1 signal or high signal is produced at the output of comparator 32a and low, or logical 0 signals are produced at the outputs of comparators 32b, 32c. Alternatively, if the frequency of the received pulse is in the middle portion of the band of frequencies passed by radio frequency amplifier 24 a relatively large DC voltage is produced at the output of detector 30b and if such DC voltage is larger than the threshold voltage $V_{TH}$ a logical 1 signal is produced at the output of comparator 32b and low, or logical 0 signals are produced at the outputs of comparators 32a, 32c. Similarly, if the radio frequency pulse has a frequency in the lower third of the band of frequencies passed by amplifier 24 a relatively large DC voltage is produced at the output of detector 30c and if such DC voltage is larger than the threshold voltage $V_{TH}$ a logical 1 signal is produced at the output of comparator 32c and logical 0 signals are produced at the outputs of comparators 32a, 32b. Thus, the outputs of comparators 32a to 32c may be considered as producing a three bit digital word. If each bit in such word is a logical 0 such digital word indicates that there is no received signal having a level sufficient to exceed the threshold voltage $V_{TH}$. If however a logical 1 signal is produced at the output of comparator 32a (comparators 32b and 32c producing logical 0 signals) detection of a received pulse is indicated and the frequency of such pulse is represented by a $(100)_2$ digital word indicating that the frequency of the received pulse is in the upper third of the band of frequencies passed by amplifier 24. Similarly, if the digital words produced at the comparators 32a, 32b and 32c are $(010)_2$ such digital word again indicates the presence of a received pulse and also indicates that the frequency of such received pulse is in the middle portion of the band of frequencies passed by amplifier 24. Still similarly, if the logical signals produced by comparators 32a, 32b and 32c are $(001)_2$ respectively, such digital word again indicates the reception of a received pulse. However, the frequency of such received pulse under such condition is indicated as being in the lower third of the band of frequencies passed by amplifier 24. The signals produced at the output of comparators 32a, 32b and 32c and on lines 19a, 19b and 19c of direction finding apparatus 18 provide a composite digital word here a six bit digital word on bus 20. The first portion of the digital word i.e. here the lower order bits, indicates, as described above, the direction of a received pulse and the second portion, i.e. the higher order bits of the digital word, represents the frequency of the received pulse.

The signals produced at the output of comparators 32a, 32b and 32c are fed to an NOR gate 34 as shown. It follows then that in response to detection of a received pulse the output of the NOR gate goes from a logical 1 signal to a logical 0 signal to produce a receiver strobe pulse on line 35. Such receiver strobe pulse is fed to a multiplexer 36 as shown. As will become apparent each time a receiver strobe pulse is produced at the output of NOR gate 34 (on line 35) the digital word produced on bus 20 by receiver 12 becomes stored in memory buffer 14, the details of which will be described in connection with FIG. 2. Suffice it to say here that each time a radio frequency pulse of sufficient strength is received by the receiver 12 a receiver strobe pulse is produced on line 35 and a digital word is produced on bus 20 indicating the direction and the frequency of the received pulse. Since each different emitter may be considered as having a unique direction and frequency it follows then that each different digital word produced on bus 20 represents a different one of the emitters. Buffer 14, for reasons to be described in connection with FIG. 2 stores a digital word representative of the number of times pulses from each one of the emitters has been received. This information is available to a digital computer 16 which, when such information is desired by the computer 16, produces an interrogation strobe pulse on line 52, and a digital word on bus 43 representative of the direction and frequency of a selected, potential emitter. In response to such pulse and such digital word, the digital word stored in the memory buffer 14, representative of the number of times pulses from the selected, potential emitter have been received, is read from the buffer memory 14 and fed to the digital computer 16. In response to this information the digital computer 16 provides appropriate signals to a jamming signal generator 18. Such jamming signal generator 18 then provides appropriate modulating signals for retransmission to the appropriate emitter via transmitting antenna 19. As will be described, during the interrogation period the memory buffer 14 is able to continue to process digital words produced by the receiver 12.

The digital words produced on bus 20 are fed to a pair of latching multiplexers 40, 42 as shown. Also fed to such latching multiplexers 40, 42 are digital words produced on bus 43 by digital computer 16. Each digital word produced on bus 43, like each digital word produced on bus 20 by the receiver 12, is here a six bit digital word, the lower order three bits representing the direction of a selected, potential emitter and the higher order three bits representing the frequency of the pulse produced by such emitter. As described above, each time a pulse from an emitter has a sufficient level above the threshold level $V_{TH}$ a receiver strobe pulse is produced at the output of NOR gate 34 on line 35. Likewise, each time the digital computer 16 wishes to interrogate the memory buffer 14 to determine the number of times pulses have been received from a selected, potential emitter, an interrogating pulse is produced by the digital computer 16 on line 52. Digital computer 16 also supplies clock pulses (as shown in FIG. 3A) at a predetermined periodic rate to a flip-flop 49 via line 51. In response to each clock pulse on line 51 the flip-flop 49 changes state so that the Q output thereof changes from a logical 1 state to a logical 0 state or from a logical 0 state to a logical 1 state; and the $\bar{Q}$ output of such flip-flop changes in complementary manner. The Q output of flip-flop 49 is coupled to the select terminal S, of the multiplexer 36 and is also coupled to the memory buffer 14 via line SLA. The $\bar{Q}$ output of flip-flop 49 is coupled to the memory buffer 14 via line SLB, as shown. In response to a logical 0 signal produced at the Q output of flip-flop 49 line 35 becomes coupled to output $Y_1$ of multiplexer 36 and line 52 becomes coupled to the output $Y_2$ of multiplexer 36. Conversely, when the Q output of flip-flop 49 is a logical 1 line 35 becomes coupled to output $Y_2$ of multiplexer 36 and line 52 becomes coupled to output $Y_1$ of multiplexer 36. It follows then that in response to each clock pulse on line 51 the output $Y_1$ of multiplexer 36 becomes alternatively coupled between line 35 and line 52 and the output $Y_2$ becomes alternatively coupled between line 52 and line 35.

Considering the condition when the Q output of flip-flop 49 is logical 0, in response to a receiver strobe pulse on line 35 such strobe pulse becomes coupled to output $Y_1$ of multiplexer 36 and is fed to terminal SR of controller 48 (the details of which will be described in connection with FIG. 2) via line STA. In response to such receiver strobe pulse, and in response to the logical 0 on line SLA, latching multiplexer 40 stores or latches the digital word produced by the receiver 12 on bus 20 and presents such stored digital word as an address to a random access memory (RAM) 44. Controller 48 then provides a read enable signal to RAM 44 and the contents in the location in RAM 44 addressed by the latching multiplexer 40 are read from RAM 44 and appears on bus 47. The contents in such addressed location (which as described above represents a particular emitter having a particular direction and frequency) is zero since the contents in each of the locations of the RAM 44 have been reset to zero in a manner to be described. The contents are fed, via bus 47, to an increment logic circuit 51, the details of which will be described in connection with FIG. 2. Suffice it to say here however that such increment logic circuit 51, in response to signals produced by controller 48, increments the contents by $(1)_{10}$ and such incremented contents, are written back into RAM 44 at the location provided by the digital word produced by receiver 12 on bus 20. It follows then that since the RAM 44 had the contents of all addressable locations thereof initially reset to zero, in response to the first digital word fed thereto via from receiver 12 the contents at the address location are now $(1)_{10}$. Let us consider now a second subsequent pulse received by the receiver 12 and further consider the case where such second received pulse from a different emitter. Again, in response to the strobe pulse produced on line 35 the digital word representing the direction and frequency of this new, second, emitter on bus 20 is stored latching multiplexer 40 and such digital word provides an address for the RAM 44. Since the contents in such address are initially zero the increment logic circuit 51 produces a $(1)_{10}$ so that the contents at the addressed location of RAM 44 are now $(1)_{10}$. Next, consider that a pulse from the first received emitter is again received, now for the second time. Again, a receiver strobe pulse is produced on line 35 and a digital word is produced on bus 20, such digital word representing the direction and frequency of this new received pulse. Since this received pulse is from the same emitter as the first received pulse the digital word produced on bus 20 is identical to the digital word produced in response to the first received pulse. Consequently, such digital word addresses RAM 44 at the same address as the first digital word produced by the receiver 12. Now however, the contents at the addressed location represents a count of $(1)_{10}$. The contents $(1)_{10}$ are fed again, via bus 48, to increment logic circuit 51 where it is incremented to $(2)_{10}$ and the such $(2)_{10}$ is written back into the RAM 44 at the same address location. The contents then of the RAM 44 at the location associated with the first emitter is now $(2)_{10}$ indicating that two pulses have been received from this emitter. A little thought will make it apparent then that as pulses from each new emitter are received, or pulses from previously received emitters are received, the contents at each location in RAM 44 will represent the number of times pulses have been received from emitters corresponding to these locations.

In response to a clock pulse produced by the digital computer 16 on line 51 the Q output of flip-flop 49 changes to a logical 1 and the $\overline{Q}$ output thereof changes to a logical 0 thereby allowing the digital computer 16 to interrogate the contents of RAM 44 and allowing digital words produced by receiver 12 in response to received emitter pulses to address RAM 46. Consider now that the digital computer 16 wishes to interrogate the memory buffer 14 to determine how many pulses have been received from selected, potential emitters from a time interval between the time preceeding the last clock pulse was produced on line 51 and the time subsequent to the next to the last clock pulse produced on line 51. A digital word representing the direction and frequency of a potential emitter selected by computer 16 is fed to bus 43. An interrogation strobe pulse is produced by the digital computer 16 on line 52. The interrogating strobe pulse on line 52 is coupled to the $Y_1$ output of multiplexer 36 because of the logical 1 signal of the Q output of flip-flop 49. In response to the interrogation strobe pulse at the output $Y_1$ of multiplexer 36 and fed to terminal SR of controller 48 via line STA, and in response to a logical 1 signal at the Q output of flip-flop 49 and fed to terminal SL of controller 48 via line SLA, controller 48 operates to cause the digital word on bus 43 to become coupled to the address terminals of RAM 44. Consider for example that the digital word on bus 43 represents the direction and frequency of the first received emitter described above when line SLA produced a logical 0 signal and consider that such emitter had been received ten times during the last time interval. The digital word on bus 43 thus addresses the location which corresponds to such selected emitter and the contents at such location, in this example ten is fed, are fed via bus 47, to a multiplexer 54. In response to the logical 0 signal produced at the $\overline{Q}$ output of flip-flop 49 (and hence on line SLB) multiplexer 54 couples bus 47, and hence the contents of the addressed location of RAM 44, to the digital computer 16 via multiplexer 54 and bus 56. It is noted that during this period of time any receiver strobe pulses produced on line 35 becomes coupled to output $Y_2$ of multiplexer 36. These receiver strobe pulses are coupled to controller 50, via line STB and terminal SR, along with the logical 0 signal produced at the $\overline{Q}$ output of flip-flop 49 via line SLB and terminal SL. In response to such signals each digital word produced by receiver 12 is coupled into latching multiplexer 42 and provides the address for RAM 46. The contents of such RAM 46 are then read therefrom and fed to increment logic circuit 60 (the details of which will be discussed in connection with FIG. 2) via bus 62. Suffice it to say here that, like the increment logic circuit 51 described above, increment logic circuit 60 increments the contents read from the memory 46 at the addressed location and such incremented contents are written back into the RAM 46 at the same addressed location. It follows then that latching multiplexer 42, RAM 46, and increment logic circuit 60 operate in the manner described above for latching multiplexer 40, RAM 44 and increment logic circuit 51 so that each location of RAM 46 provides an indication of the number of pulses received from each one of the received emitters during the interval of time the digital computer 16 is able to interrogate the contents of RAM 44. Therefore, during the time available by the computer 16 to interrogate RAM 44, information concerning the number of pulses received by emitters are stored in the RAM 46. In response to the next subsequent clock pulse on line 51 the state of flip-flop 49 changes to its original state so that the Q output thereof is logical 0 and the output is logical 1. Therefore information from received emitters is again stored in RAM 44 (such RAM 44 having its contents reset to zero) and the contents of RAM 46 may be interrogated by the digital computer 16. That is, the contents in RAM 46 are interrogatable by the digital computer 16 and data concerning new received pulses are storable in RAM 44, as described above. Here, however, the contents read from RAM 46 are coupled to digital computer 16 via bus 62 because such bus 62 becomes coupled through multiplexer 54 to bus 56 as such multiplexer 54 responds to a logical 1 signal on line SLB.

Figure 2:
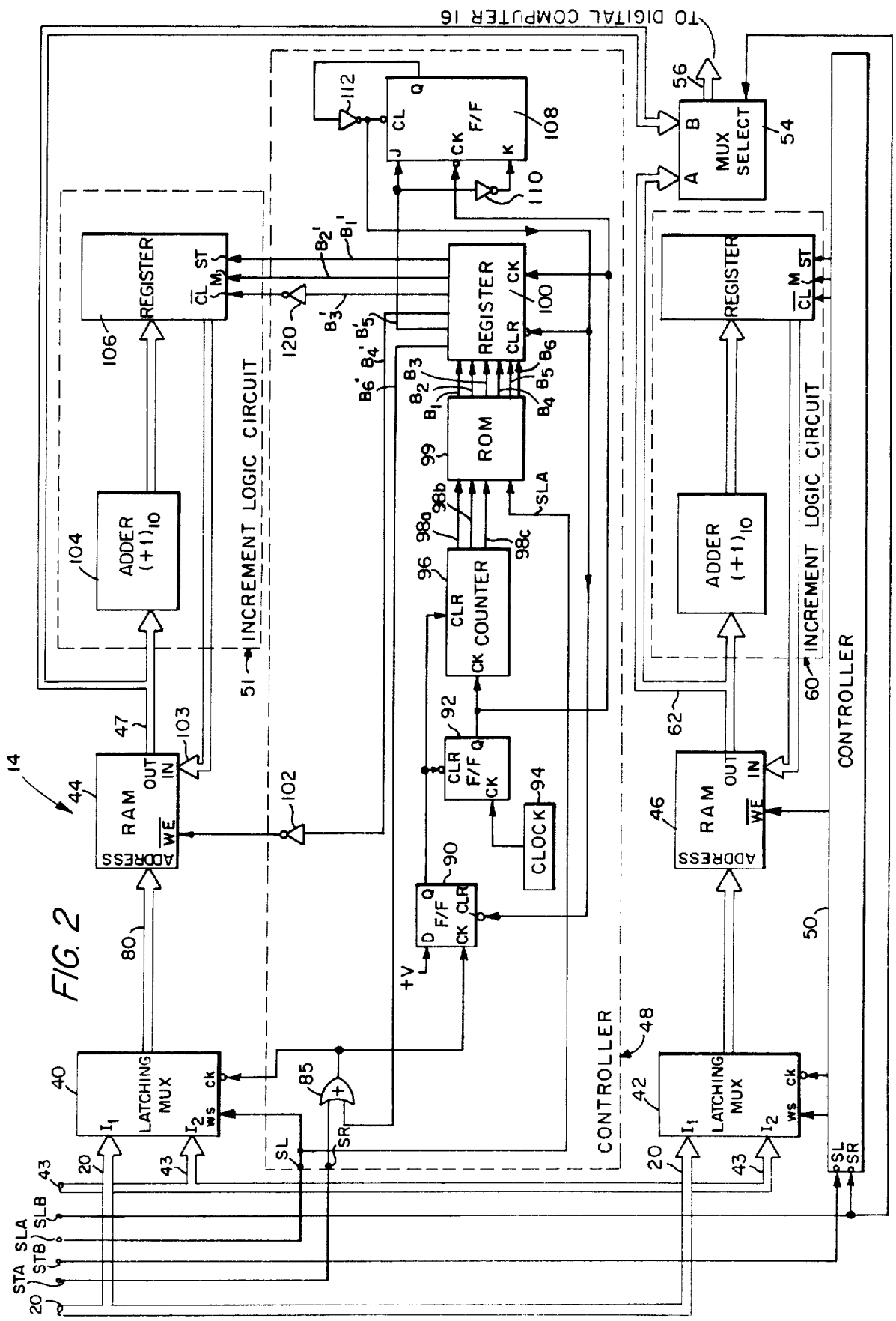
FIG. 2 is a block diagram of the memory buffer used in the ECM system of FIG. 1.

Referring now to FIG. 2 the details of the memory buffer 14 are shown. As described in connection with FIG. 1 a pair of latching multiplexers 40, 42 (here model 54298 manufactured by Texas Instruments, Inc., Dallas, Tex.) have a pair of input terminals $I_1$ and $I_2$ coupled to bus 20 and bus 43 respectively, as shown. Latching multiplexer 40 is fed by control signals produced by controller 48 in response to signals on lines STA, SLA. In particular, controller 48 produces a write select signal for terminal WS and a clock signal for terminal CK of latching multiplexer 40 in response to signals produced by multiplexer 36 (FIG. 1) on lines STA, SLA in a manner to be described. Controller 50 is identical in construction to controller 48 and produces a write enable signal for terminal WS and a clock signal for terminal CK of latching multiplexer 42 in response to signals produced by multiplexer 36 on lines STB, SLB in a manner to be described. Considering the case where the Q output of flip-flop 49 is logical 0 and $\bar{Q}$ output of such flip-flop is logical 1 and receiver strobe pulse produced on line 35 is coupled to line STA, as shown in FIGS. 3D and 3F. A logical 0 signal is present on line SLA and a logical 1 signal is present on line SLB as shown in FIGS. 3B and 3C. In response to the receiver strobe pulse on line STA and the logical 0 signal on line SLA the digital word on bus 20 is stored in the latching multiplexer 40 and appears on bus 80 to provide the address signal for RAM 44 as indicated, as shown in FIG. 3H. The receiver strobe pulse passes through OR gate 85 to the clock (CK) terminal of D flip-flop 90 as shown. A logical 1 signal produced by a +V volt supply is coupled to the D terminal of flip-flop 90. In response to the receiver strobe pulse passing through OR gate 85 a logical 1 becomes stored in flip-flop 90 and a logical 1 is produced at the Q output thereof as shown in FIG. 3J. This logical 1 signal removes the clear signal fed to flip-flop 92 and enables such flip-flop 92 to respond to clock signals fed thereto by a conventional clock 94, as shown in FIG. 3K. Further, this logical 1 signal removes the reset on counter 96 as shown in FIG. 3L. In response to such clock pulses produced by clock 94, the Q output of flip-flop 92 produces a square wave signal as shown in FIG. 3K. This square wave signal is fed to the (CK) terminal of the counter 96. Counter 96 is of any convention design and increments its contents in response to the positive going edge of each clock pulse fed to the CK terminal thereof as shown in FIG. 3L. The counter 96 provides a digital word representative of the number of clock pulses fed thereto. Each bit representative of the contents of counter 96 is fed to a corresponding one of the lines 98a to 98c. Lines 98a to 98c are fed to read only memory (ROM) 99. As will become apparent counter 96 becomes reset after a count of $(3)_{10}$. Also fed to such ROM 99 is a logical signal produced on line SLA. The output of ROM 99 appears on lines $B_1$ to $B_6$. The contents of ROM 99 are represented in the table below:

| Contents | Lines | | | | Lines | | | | | |
|---|---|---|---|---|---|---|---|---|---|---|
| Counter 96 | SLA | 98a | 98b | 98c | $B_6$ | $B_5$ | $B_4$ | $B_3$ | $B_2$ | $B_1$ |
| $(0)_{10}$ | 0 | 0 | 0 | 0 | 1 | 0 | 0 | 0 | 0 | 1 |
| $(1)_{10}$ | 0 | 0 | 0 | 1 | 1 | 0 | 0 | 0 | 1 | 0 |
| $(2)_{10}$ | 0 | 0 | 1 | 0 | 1 | 0 | 1 | 0 | 1 | 0 |
| $(3)_{10}$ | 0 | 0 | 1 | 1 | 1 | 1 | 0 | 0 | 0 | 0 |
| $(0)_{10}$ | 1 | 0 | 0 | 0 | 0 | 0 | 0 | 1 | 0 | 0 |
| $(1)_{10}$ | 1 | 0 | 0 | 1 | 0 | 0 | 1 | 1 | 0 | 0 |
| $(2)_{10}$ | 1 | 0 | 1 | 0 | 0 | 1 | 0 | 0 | 0 | 0 |

The output of ROM 99 is fed to a register 100. In response to a logical 0 signal produced at the output Q of flip-flop 92 the contents of the ROM 99 are stored in the register 100 the contents of lines $B_1$ to $B_6$ appearing on lines $B_1'$ to $B_6'$, respectively. It is noted that the contents of the register 100 are initially zero so that the logical 0 signal produced on line $B_4'$ becomes converted to a logical 1 signal by inverter 102. Such logical 1 signal is fed to the $\overline{WE}$ terminal of RAM 44 thereby disabling contents fed to the input terminal (IN) of RAM 44 via bus 103 from becoming stored therein. The contents at the location addressed by the data on bus 80 (the digital word on bus 20) however appears at output bus 47 and are fed to both terminal B of multiplexer 54 and to the input of an adder 104. Such adder 104 is of any conventional design and adds one (i.e. $(1)_{10}$) to the digital word produced on bus 47 to increment such digital word by one. Hence if the contents of the location addressed by the digital word on bus 80 is $(N)_{10}$, $(N+1)_{10}$ is produced at the output of adder 104. The output of adder 104 is fed to the input of a register 106. The register 106 is model no. 54S412 manufactured by Texas Instruments Inc., Dallas, Tex. Line $B_1'$ is fed to the strobe terminal (ST) of register 106 and line $B_2'$ is fed to the mode terminal (M) of such register 106. As noted from the table above, when the contents of counter 96 are zero, ROM 99 produces a logical 1 signal on lines $B_1$ and $B_6$ and logical 0 signals on lines $B_2$ to $B_5$. These logical signals become stored in register 100 so that correspondingly logical 1 signals become produced on lines $B_1'$ and $B_6'$ and logical 0 signals are produced at line $B_2'$ to $B_5'$ as shown in FIGS. 3M to 3R. In response to the logical signal produced on line $B_1'$ register 106 follows the level of the signals fed thereto from adder 104. The logical 1 signal produced on output terminal $B_6'$ is fed to an OR gate 85 and inhibits any more strobe pulses on line STA from effecting latching multiplexer 40. When the contents of counter 96 are incremented to a count of $(1)_{10}$, because line SLA is 0, a logical 1 signal is produced at the output terminal $B_2'$ (as shown in FIG. 3N) which enables register 106 to store the digital word produced by adder 104. That is, register 106 now stores the contents of the location addressed in the RAM 44 incremented by $(1)_{10}$. When the contents of counter 96 are again incremented to a count of $(2)_{10}$, because line SLA is logical 0, a logical 1 signal is produced on line $B_4'$ (as shown in FIG. 3O). This logical 1 signal is converted by inverter 102 to a logical 0 signal thereby enabling the RAM 44 to store the digital words stored in register 106 and fed to the input terminal IN of such RAM 44 via bus 103. It follows then that the contents in the location addressed by the digital word on bus 80 is now restored after having been incremented by one. In response to the contents of counter 96 being incremented to a count of $(3)_{10}$ and because line SLA is logical 0 a logical 1 signal is produced on line $B_5'$ as shown in FIG. 3Q. This signal is fed to a flip-flop 108, in particular to the J terminal thereof and through an inverter 110 to the K terminal thereof. In response to the trailing edge of a clock pulse fed to the CK terminal of flip-flop 108 from flip-flop 92 to Q output of flip-flop 108 produces a logical 1 signal which becomes to a logical 0 signal by inverter 112. This logical 0 signal clears flip-flop 108 and also clears register 100 and flip-flop 90 as shown in FIG. 3I. It follows then that as long as the signal on line SLA is 0, each time a pulse from an emitter is received the digital word representative of that pulse addresses RAM 44, the contents at the addressed location of such RAM 44 are the incremented by one, and such incremented contents are stored at the same addressed location. Consequently, each address in the RAM 44 represents the number of times pulses from the emitter corresponding to such address have been received by the receiver 12 (FIG. 1).

In response to a clock pulse produced by digital computer 16 on line 51 (FIG. 1) the state of flip-flop 49 (FIG. 1) is complimented and a logical 1 signal now is produced on line SLA as shown in FIG. 3B. Further a logical 0 signal is produced on line SLB by flip-flop 49 as shown in FIG. 3C. Still further the logical 1 signal produced at the Q output of flip-flop 49 causes multiplexer 36 to couple any receiver strobe pulses on line 35 to line STB as shown in FIGS. 3D and 3G and interrogation pulses on line 52 to line STA as shown in FIGS. 3E and 3F. Controller 50 in response to the logical 1 signal on line SLB and to receiver strobe pulses fed thereto on line STB operates in the manner described above for controller 48 so that RAM 46 stores at each addressed location a number representative of the number of pulses have been received from an emitter corresponding to such location.

While controller 50 operates in response to receiver strobe pulses, controller 48 operates to enable digital computer 16 to interrogate the contents of RAM 44. That is, the logical 1 signal on line SLA (FIG. 3B) and the interrogation strobe pulse fed to line STA from the digital computer 16 (FIGS. 3E and 3F) act to couple the digital word on bus 43 to latching multiplexer 40 and thereby provide the address for RAM 44. The contents stored in the addressed location, which represents the number of pulses received from the emitter corresponding to such addresses, are coupled from bus 47, through multiplexer 54 to computer 16 via bus 56 in response to a logical 0 signal on line SLB as shown in FIG. 3S. The interrogating strobe pulse on line STA is fed to flip-flop 90 (FIG. 2) and causes such flip-flop 90 to produce a logical 1 signal at the Q output thereof (as shown in FIG. 3J) thereby to remove the clear signal from flip-flop 92 and to stop clearing counter 96. In response to clock pulses fed to counter 96 from clock 94 and through flip-flop 92 signals are produced on lines 98a to 98c which represent the counters of such counter 96. Such lines are fed to ROM 99 along with line SLA which now is a logical 1 signal. Therefore from the table above, when the contents of counter 96 are $(0)_{10}$ a logical 1 signal is produced on line $B_3'$ as shown in FIG. 3O. Such logical 1 signal is converted to a logical 0 signal by inverter 120 thereby to clear the contents of register 106 to $(0)_{10}$. In response to the next clock pulse the count of counter 96 becomes $(1)_{10}$ and a logical 1 signal remains a line $B_3'$ as shown in FIG. 3O. When the contents of counter 96 are incremented to $(2)_{10}$ the logical 1 remains on line $B_3'$ so that the contents of register 106 are $(0)_{10}$ but a logical 1 signal is produced on line $B_4'$ (as shown in FIG. 3P) to produce a logical 0 on the WE terminal of RAM 44. In response thereto RAM 44 stores the contents of register 106 in the addressed location; therefore a $(0)_{10}$ is written into the addressed location of RAM 44 to reset or clear the addressed location to zero. In response to the next clock pulse counter 96 increments to $(3)_{10}$ and ROM 99 produces a logical 1 signal on line $B_5'$ as shown. This logical 1 signal is fed to flip-flop 108 and resets such flip-flop along with register 100 and flip-flop 90. It is noted then that while controller 48 operates to enable interrogation by the digital computer 16 of the contents in the RAM 44 at an address corresponding to a particular emitter selected by the computer 16 the contents after being read from such RAM 44 are reset to zero. Further and simultaneously therewith, controller 50 operates in response to receiver strobe pulses and digital words applied by the receiver 12 via bus 20 to enable digital word produced by the receiver to become stored in RAM 46 at appropriate locations corresponding to the received emitter. It is also noted that during the time controller 48 responds to interrogation signals produced by the digital computer 16, multiplexer 54 couples data produced on bus 47 (i.e. at terminal B of multiplexer 54) to the digital computer 16 via such multiplexer 54 in response to a logical zero signal on line SLB as shown in FIG. 3S. Similarly, as mentioned above when controller 50 responds to interrogation signals from the digital computer 16 the data on bus 62 (at terminal A of multiplexer 54) becomes coupled to output bus 56 of multiplexer 54 in response to a logical 1 signal produced on line SLB as shown in FIG. 3S.

Having described a preferred embodiment of the invention, other embodiments incorporating these concepts may now become apparent to those of skill in the art. For example, while here each address was a six bit digital word a larger number of bits may be used to more accurately define the direction and frequency of the emitters. It is felt, therefore, that this invention should not be restricted to the disclosed embodiment but rather should be limited only by the spirit and scope of the appended claims.

What is claimed is:

1. A memory buffer for providing an indication of the number of times signals having a unique characteristic have been produced by an input system and for supplying such indication to an output system, such memory buffer comprising:

(a) a pair of addressable memories;

(b) means for producing timing pulses independently of the signals produced by the input system, such timing pulses indicating a first predetermined period of time and a second, subsequent, predetermined period of time;

(c) a plurality of switching means, each one having a pair of input terminals, a first one thereof being fed by the input system and a second one thereof being fed by the output system and responsive to the timing pulses for coupling, during the first predetermined period of time, digital words produced by the input system to identify the characteristics produced by the input signal to address terminals of a first one of said pair of addressable memories the locations of each one of the memories being associated with the unique characteristic of the produced signals, and for coupling during the first period of time, digital words produced by the output system to identify characteristics of the signals produced by the input system to a second one of the pair of addressable memories and for coupling, during the second predetermined period of time, the digital words produced by the input system to address terminals of the second one of the pair of addressable memories and the digital words produced by the output system to the first one of the pair of memories;

(d) means, responsive to data stored in the locations of the first one of the pair of memories addressed by the input system during the first period of time for incrementing the data in such addressed location and for transferring such incremented data for storage in such first one of the addressable memories at the addressed location, such stored data providing an indication of the number of times signals have been produced by the input system with the unique characteristic associated with the location addressed by the input system;

(e) output switching means having a pair of input terminals coupled to the pair of addressable memories and responsive to the timing pulses for coupling the data stored in the location of the first one of the pair of memories addressed by the output system during the second period of time to such output system to provide such output system with an indication of the number of times signals having the unique characteristic associated with the location addressed by the output system have been produced by the input system during the first predetermined period of time.

2. The memory buffer recited in claim 1 wherein each one of the plurality of switching means includes a multiplexer.

3. The memory buffer recited in claim 2 wherein the output switching means includes a multiplexer.

* * * * *